United States Patent [19]

Barry

[11] 4,140,968
[45] Feb. 20, 1979

[54] DAMPING OF ELECTRICAL MEASURING INSTRUMENTS

[75] Inventor: Thomas J. Barry, Witham, England

[73] Assignee: Crompton Parkinson Limited, London, England

[21] Appl. No.: 845,032

[22] Filed: Oct. 25, 1977

[30] Foreign Application Priority Data

Jul. 13, 1977 [GB] United Kingdom ............... 29466/77

[51] Int. Cl.² .......................... G01R 1/14; G01R 5/00
[52] U.S. Cl. ...................................... 324/125; 73/430; 324/154 R
[58] Field of Search ............. 324/125, 154 R, 154 PB, 324/155; 73/430

[56] References Cited

U.S. PATENT DOCUMENTS

| | | | |
|---|---|---|---|
| 3,439,273 | 4/1969 | Sills | 324/125 |
| 3,590,375 | 6/1971 | Sills | 324/154 R |
| 3,919,632 | 11/1975 | Roerty | 324/125 |
| 3,932,809 | 1/1976 | Frank | 324/154 R X |

FOREIGN PATENT DOCUMENTS 1295935 11/1972 United Kingdom ...................... 73/430

Primary Examiner—Gerard R. Strecker
Attorney, Agent, or Firm—Larson, Taylor and Hinds

[57] ABSTRACT

An improvement to an electrical measuring instrument having a rotary moving part capable of longitudinal movement in relation to the remainder of the instrument and including a damping arrangement comprising co-operating pads fitted respectively to the moving part and an adjacent fixed part to define a gap between the adjacent surfaces of the pads containing viscous liquid held in position by surface tension, the improvement comprising one of the pads being formed of glass-filled plastics material and the gap, when seen in cross-section, having substantially parallel sides which diverge at the edge of the gap, preferably to define a wide-angled V. Preferably the second pad has a smooth surface and may be formed of a light metal.

6 Claims, 1 Drawing Figure

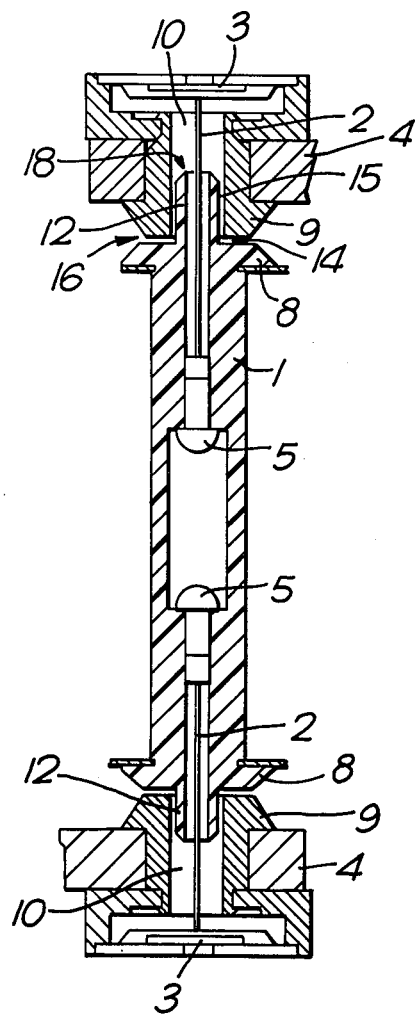

DAMPING OF ELECTRICAL MEASURING INSTRUMENTS

Electrical measuring instruments such as ammeters and voltmeters having a rotary moving part are normally fitted with some form of device for damping the rotary movement of this part, thus causing the pointer of the instrument to come to a standstill at the correct reading in a short space of time. When the moving part turns about pivots mounted in jewels this type of damping is quite satisfactory. Many modern instruments, however, are fitted with a taut ribbon suspension which avoids the need for jewels altogether. This form of suspension has a much greater resistance to shock than jewels but the freedom thus given to the moving part means that it is susceptible to vibrations in relation to the fixed parts of the instrument. The damping devices normally fitted are quite ineffective against such vibratory movement and the problems thus introduced have been one of the major disadvantages of instruments employing such suspension.

A solution to this problem was first proposed in British Pat. No: 1,124,667 which described a damping arrangement comprising co-operating pads of a cellular elastomer having a closed cell structure presenting a large number of small open cells on the facing surfaces of the pads, the pads being fitted respectively to the moving part and to an adjacent fixed part, to define a gap between the adjacent surfaces of the pads containing viscous liquid held in position by surface tension. It was found that this combination was highly effective in damping any incipient vibratory movement of the moving parts of the instrument and thus overcame the problem referred to.

Subsequent development work showed that a similar result could be obtained if only one of the pads was formed of the closed cell elastomer having a surface layer of open cells, the other pad being of a material having a relatively smooth surface as described in British Pat. No: 1,295,935. Not only did this modified construction give equally good results from the damping point of view, but it simplified the construction and overcame minor problems which were found to result from the use of two pads of cellular elastomer.

It has now been found possible to simplify the construction still further and according to the present invention one of the pads of a damping arrangement of this same general type is formed of glass-filled plastics material and the gap, when seen in cross section, has substantially parallel sides which diverge at the edge of the gap. The term "glass-filled plastics material" describes a material such as nylon filled with a proportion of short glass fibres extending to the surface of the pad, the effect of these glass fibres at the surface being to provide a minute degree of roughening which is found to provide a frictional grip on the viscous damping liquid sufficient to produce the required damping effect while, at the same time, holding the liquid in position in the gap between the two pads. Any vibration of the moving parts in an axial direction produces a pumping action tending to expel liquid from the parallel portion of the gap and this liquid then collects in the divergent portion of the gap and returns again to the parallel portion of the gap when conditions are stabilised. The divergent portion of the gap is conveniently in the form of a wide-angled V.

The second pad of the damping arrangement preferably has a smooth surface, although it may also be of similar material to the first pad. A smooth-surfaced pad of a light metal such as alumimium is found to be particularly suitable.

The dimensions and proportions of the glass fibres in the plastics material are not critical, but a proportion in the region of 30 to 35% is found to give good results. As mentioned above, it is important that the fibres should extend to the operative surface of the pad, but it is found that this occurs automatically as a result of the moulding operation. Various plastics materials are suitable, of which nylon is one example and several proprietary materials which are available in the form of moulding pellets already filled with glass are eminently suitable for use in accordance with the invention. In particular, the glass filled nylon sold by I.C.I. under the registered trade mark "Maranyl" and the glass filled nylon sold by Dynamit Nobel Chemicals of West Germany under the registered trade mark "Trodamid" T.G.35 are both very suitable.

Quite apart from the increased simplification in the production of the damping pads themselves, i.e. the fact that they merely require moulding rather than slicing from a block of cellular elastomer, a further simplification arises from the fact that the pads can be moulded integrally with the main body of the movement of the instrument. Generally speaking, a damping arrangement will be required at each end of the moving part and a rotary staff forming the central core of the moving part can be moulded integrally with the first pads of the two damping arrangements of glass filled plastics material. In other words, instead of merely securing the pads to the ends of the rotary staff, the ends of the staff are shaped to define the damping pads as a single unitary moulding. These pads then co-operate with pads of aluminium or similar material fixed to the frame of the instrument.

The accompanying drawing is a cross sectional view of a rotary staff forming the central core of the moving part of a so-called long-scale instrument, the remainder of the moving part and of the stationary frame of the instrument being omitted since they are of standard construction.

A damping arrangement of the form illustrated is equally applicable to any electrical measuring instrument having a rotary moving part capable of longitudinal movement in relation to the remainder of the instrument, e.g. as a result of a taut ribbon suspension.

In the drawing, the rotary staff forming the central core of the moving part is shown as 1 and is provided at each end with a suspension formed by a taut metallic ribbon 2 extending between a spring anchorage 3 secured to the frame of the instrument, part of which is shown as 4, and fixed at the other end by a moulded plug 5 to the staff 1. The taut ribbons 2 provide the necessary rotary movement of the staff 1, but also permit axial vibration under conditions of shock, for example.

Damping is provided by pads 8 moulded integrally with the ends of the staff 1 from glass-filled plastics material as previously described. These co-operate with aluminium pads 9 mounted on the frame of the instrument 4. Each aluminium pad 9 is formed with a central bore 10 which receives a spigot portion 12 on the end of the staff 1. Each pair of pads 8 and 9 co-operates so as to define a gap between them comprising a radially extending portion 14 and an axially extending portion 15, both of which have substantially parallel sides over the greater part of their length, but the sides of which diverge to define a V-shaped space shown as 16 in respect of the radially extending portion 14 of the gap and 18 in respect of the axially extending portion 15 of the gap. The gap as a whole contains a viscous damping liquid such as polydimethylsiloxanes which produces the required damping effect. Owing to the minute degree of roughening of the surface of the pad 8 resulting from the projecting glass fibres at this surface, the damping liquid exerts a frictional grip on the pad 8, thus exerting a damping force. Under conditions of axial vibration, any damping liquid expelled by the resultant pumping action either from the radially extending portion 14 or the axially extending portion 15 of the gap tends to collect in the space 16 or 18 respectively and then returns to the parallel part of the gap when the moving part is again stabilised.

In a particular example in which the staff 1 together with the pads 8 was moulded from Trogamid 35 and the pads 9 were of aluminium, the radial portion 14 of the gap had a dimension in the radial direction of 4.7 mm and a width of 0.3 mm while the axially extending portion 15 of the gap had an axial length of 3.0 mm and a width of 0.4 mm.

I claim:

1. In an electrical measuring instrument having a frame and a rotary moving part capable of longitudinal movement in relation to said frame and including a damping arrangement comprising co-operating first and second pads fitted respectively to said moving part and to said frame to have adjacent surfaces defining a gap between said surfaces, said gap containing viscous liquid held in position by surface tension, the improvement which comprises said first pad being formed of glass-filled plastics material in which a proportion of short glass fibers extend to the surface of the pad and provide a minute degree of roughening to provide a frictional grip on said viscous liquid so as to produce a damping effect and tend to hold the liquid in position in said gap, and said adjacent surfaces of said pads being shaped so that said gap, when seen in cross-section, has substantially parallel sides which diverge at the edge of said gap to provide a collecting area for liuqid expelled from the parallel portion of the gap by vibratory pumping action, whereby expelled liquid can return to the parallel portion of the gap when conditions are stabilized.

2. An electrical measuring instrument according to claim 1 in which the sides of said gap diverge to define a wide-angled V.

3. An electrical measuring instrument according to claim 1 in which said second pad has a smooth surface.

4. An electrical measuring instrument according to claim 3, in which said second pad is formed of a light metal.

5. An electrical measuring instrument according to claim 1, in which one of said pads has a central spigot portion and the other of said pads has a central bore co-operating with said spigot to define a gap having both a radially extending portion and an axially extending portion.

6. An electrical measuring instrument according to claim 1 having a damping arrangement at each end of said moving part, said moving part having a central core formed by a rotary staff, said rotary staff being moulded integrally with said first pad of each said damping arrangement, said integral moulding consisting of glass-filled plastics material.

* * * * *